(12) United States Patent
Gopinath et al.

(10) Patent No.: US 8,021,955 B1
(45) Date of Patent: Sep. 20, 2011

(54) METHOD CHARACTERIZING MATERIALS FOR A TRENCH ISOLATION STRUCTURE HAVING LOW TRENCH PARASITIC CAPACITANCE

(75) Inventors: Venkatesh P. Gopinath, Fremont, CA (US); Arvind Kamath, Mountain View, CA (US); Mohammad R. Mirabedini, Redwood City, CA (US); Ming-Yi Lee, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 14 days.

(21) Appl. No.: 12/574,426

(22) Filed: Oct. 6, 2009

Related U.S. Application Data

(62) Division of application No. 11/262,173, filed on Oct. 28, 2005, now Pat. No. 7,619,294, which is a division of application No. 09/991,202, filed on Nov. 14, 2001, now Pat. No. 7,001,823.

(51) Int. Cl.
*H01L 21/76* (2006.01)
(52) U.S. Cl. ........................ 438/424; 438/435
(58) Field of Classification Search .................. 438/424, 438/435
See application file for complete search history.

(56) References Cited

U.S. PATENT DOCUMENTS

| | | |
|---|---|---|
| 5,930,655 A | 7/1999 | Cooney, III |
| 5,989,998 A | 11/1999 | Sugahara et al. |
| 6,008,109 A | 12/1999 | Fulford et al. |
| 6,043,145 A | 3/2000 | Suzuki et al. |
| 6,054,379 A | 4/2000 | Yau et al. |
| 6,063,702 A | 5/2000 | Chung |
| 6,159,871 A | 12/2000 | Loboda et al. |
| 6,215,087 B1 | 4/2001 | Akahori et al. |
| 6,368,979 B1 | 4/2002 | Wang et al. |
| 6,541,367 B1 | 4/2003 | Mandal |
| 6,620,703 B2 | 9/2003 | Kunikiyo |
| 6,756,654 B2 | 6/2004 | Heo et al. |
| 6,794,266 B2 | 9/2004 | Shih et al. |
| 6,797,652 B1 | 9/2004 | Ngo et al. |
| 6,878,644 B2 | 4/2005 | Cui et al. |
| 6,914,015 B2 | 7/2005 | Belyansky et al. |
| 2003/0234433 A1 | 12/2003 | Tran |

OTHER PUBLICATIONS

Stanley Wolf and Richard N. Tauber, Silicon Processing For The VLSI Era, vol. I, Lattice Press, 1986, pp. 520-535.
Office Action in U.S. Appl. No. 09/991,202, mailed Feb. 9, 2005.

*Primary Examiner* — Alexander Ghyka
*Assistant Examiner* — Stanetta Isaac
(74) *Attorney, Agent, or Firm* — Beyer Law Group LLP

(57) ABSTRACT

Provided are methods and composition for forming a multi-layer isolation structure on an integrated circuit substrate. A process can include selecting a lower dielectric material for the lower dielectric layer and selecting an upper dielectric material for the upper dielectric layer. A range of effective dielectric constants that correspond to the thicknesses the lower and upper dielectric materials are selected. A range of thicknesses for each of the lower and upper dielectric layers are determined from a range of acceptable dielectric constants using information indicating an effective dielectric constant corresponding to thicknesses of the materials for both the lower upper dielectric layers, enabling the formation of the multi-layer isolation structure.

21 Claims, 4 Drawing Sheets

Shallow Trench Isolation Process Flow
1. Pad Oxide
2. Nitride: Trench Etch Hard Mask and CMP Stop Layer
3. Island Mask
4. Trench Etch
5. Oxide Liner: Corner Rounding
6. Trench Fill
7. Densification (Can Be Skipped)
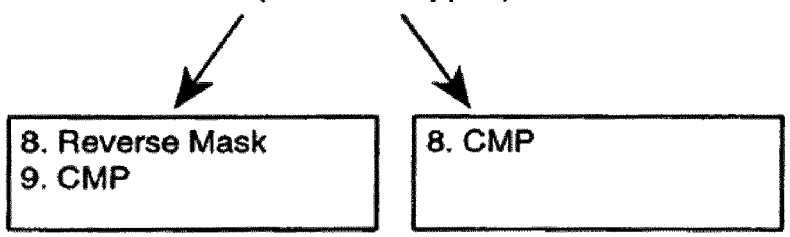
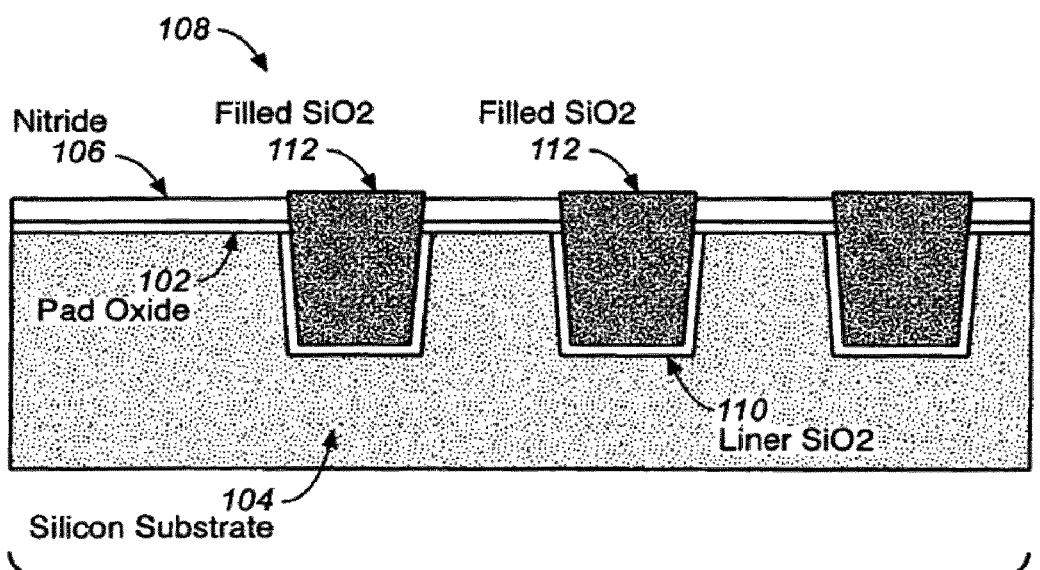
FIG._1
(PRIOR ART)

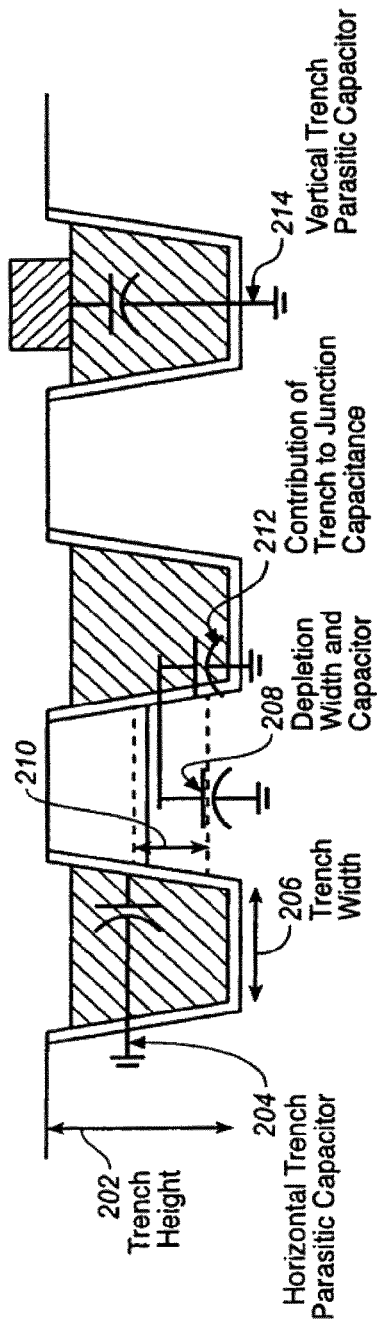
FIG._2 (PRIOR ART)
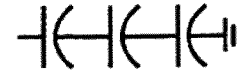
FIG._3b
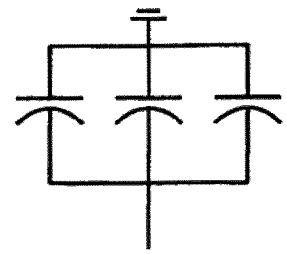
FIG._3c
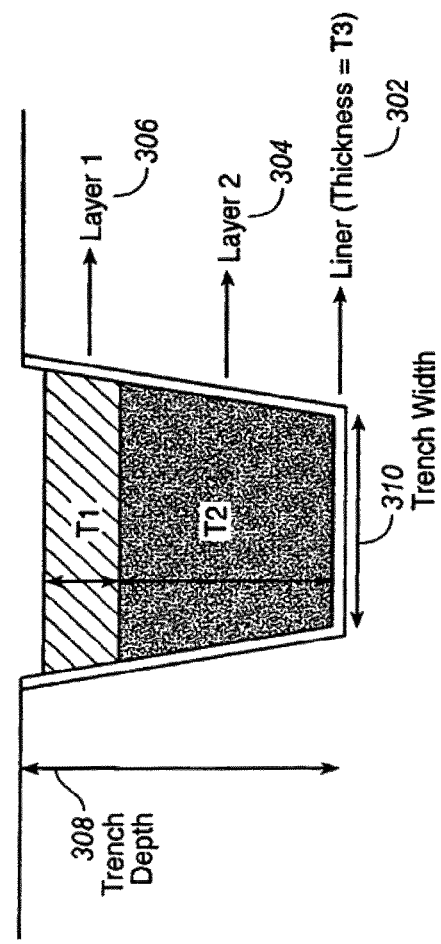
FIG._3a

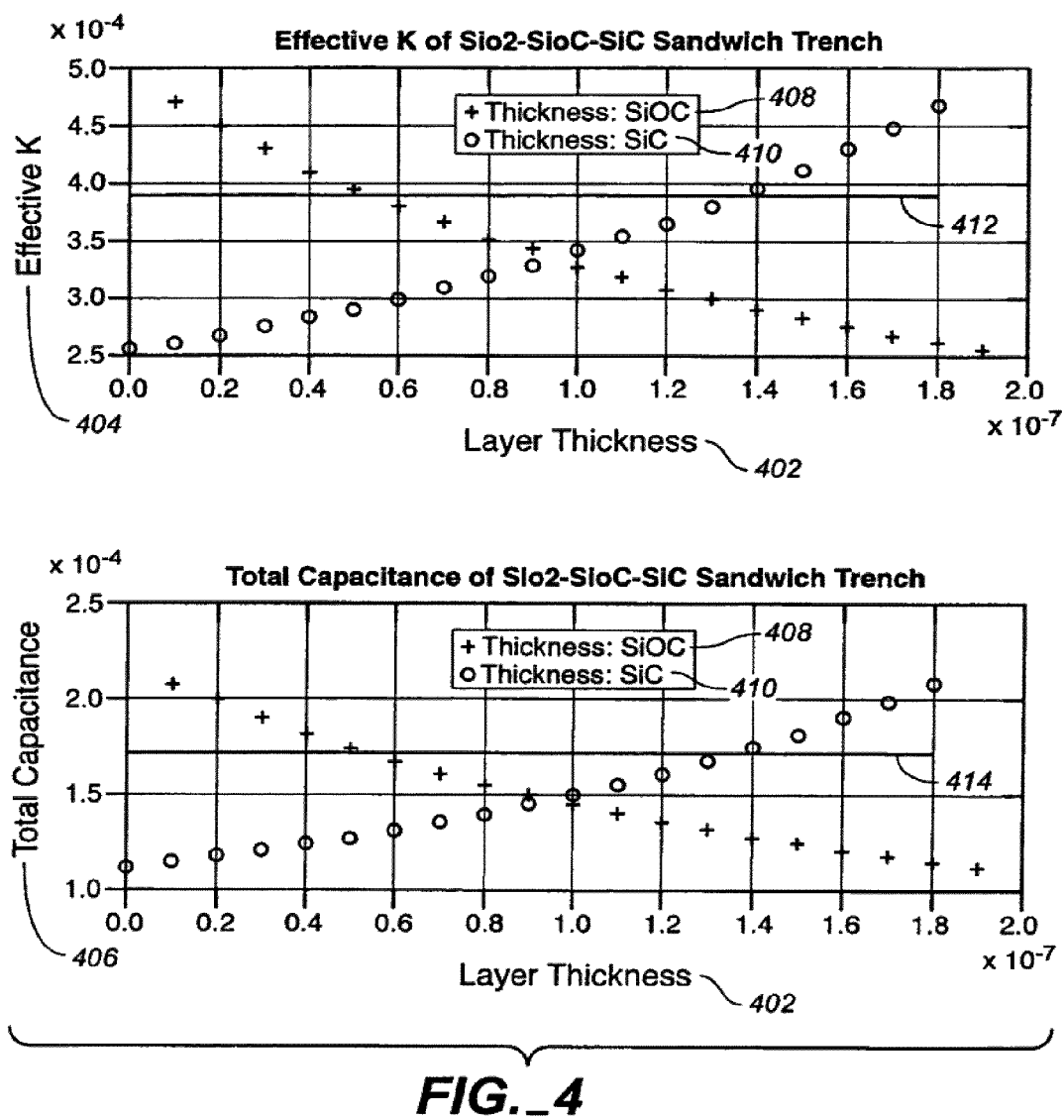
FIG._4

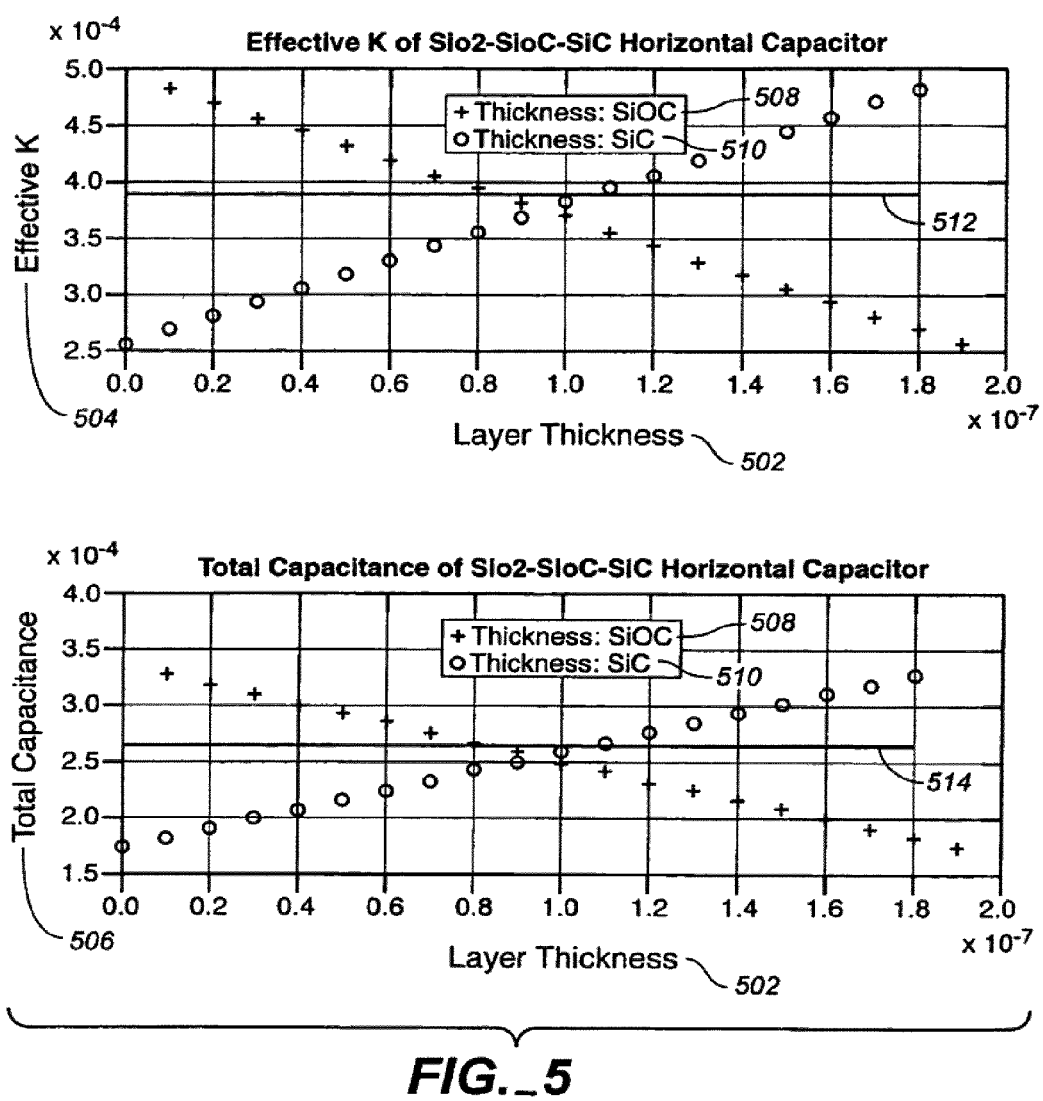
FIG._5

METHOD CHARACTERIZING MATERIALS FOR A TRENCH ISOLATION STRUCTURE HAVING LOW TRENCH PARASITIC CAPACITANCE

CROSS REFERENCE TO RELATED APPLICATIONS

This application is a divisional of application Ser. No. 11/262,173, entitled "SHALLOW TRENCH ISOLATION STRUCTURE WITH LOW TRENCH PARASITIC CAPACITANCE," filed on Oct. 28, 2005, by Gopinath, et al, which is a divisional of application Ser. No. 09/991,202, entitled "METHOD OF MANUFACTURING A SHALLOW TRENCH ISOLATION STRUCTURE WITH LOW TRENCH PARASITIC CAPACITANCE," filed on Nov. 14, 2001, by Gopinath, et al, (now U.S. Pat. No. 7,001,823). Both of the above-identified applications are hereby incorporated herein by reference for all purposes.

BACKGROUND OF THE INVENTION

1. Field of the Invention

The present invention relates to the formation of a shallow trench isolation structure in semiconductor wafer fabrication. More particularly, the present invention relates to the formation of a shallow trench isolation structure with reduced trench parasitic capacitance.

2. Description of the Related Art

Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. Layering is an operation used to add thin layers of material (typically insulator, semi-conductor or conductor) to the surface of the semiconductor wafer. Layers are typically either grown (for example, thermal oxidation of silicon to grow a silicon dioxide dielectric layer) or deposited by a variety of techniques such as chemical vapor deposition (CVD) and physical vapor deposition (PVD), including evaporation and sputtering. Patterning, is an operation that is used to remove specific portions of the top layer or layers on the wafer surface. Patterning is usually accomplished through the use of photolithography (also known as photomasking) to transfer the semiconductor design to the wafer surface.

Patterning is often used to expose an area to be etched, such as to create a trench for creation of an isolation structure. More particularly, isolation structures are often created, for instance, to separate different devices from one another.

Semiconductor device sizes have decreased dramatically over the years. In order to accommodate sub-micron IC feature sizes, various technologies have been developed and applied. Since IC feature sizes are small, shallow junctions are used, for example, to create source and drain regions. Also, shallow trench isolation has becomes preferred over LOCOS.

A conventional Shallow Trench Isolation (STI) scheme is illustrated in FIG. 1. As shown, at first, a protective blanket pad oxide 102 is grown over the silicon substrate 104, followed by a blanket nitride 106 deposition. The nitride 106 is then patterned, for example, using a photoresist and antireflective coating layer. Subsequently, the open areas are etched to create one or more trenches 108. Etching is typically performed with a highly anisotropic plasma. The photoresist is then stripped and thin oxide 110 (e.g., silicon dioxide) is grown, lining the exposed trench. This liner 110 helps remove any etch-related damage. Subsequently, an oxide film 112 is deposited in the trench, completely filling the trench areas 108 up to and above the nitride surface 106. The wafer is then planarized, using methods like Chemical Mechanical Planarization, resulting in the deposited insulator filling up only the trench areas. Current trench fill processes use standard silicon oxide (e.g., SiO2) type materials, which typically have a dielectric constant of between approximately 3.9 and 4.2. For instance, the dielectric constant of silicon dioxide is 3.9. High density plasma CVD (HDP-CVD), tetraethoxysilane-Ozone CVD (TEOS-Ozone CVD), Plasma Enhanced-CVD (PE-CVD) or Flow-Fill processes are commonly used. The results are void free, oxide filled isolation. Depending upon the quality of the deposited oxide, an additional densification step, either in oxygen or in a neutral atmosphere may be performed to improve its quality. The liner oxidation 110 detailed earlier can also be bundled into the step of depositing the oxide film 112 in the trench. Chemical Mechanical Polishing (CMP) is then typically performed to planarize the topology of the wafer surface.

As described above, current technology trends are forcing isolation regions to smaller spacing. For example, for devices with 0.1 micron nodes, isolation spacing has been projected to be in the order of about 0.13 microns. Shrinking horizontal dimensions may also lead to shrinking of trench depth (i.e., vertical dimensions) of the isolation structure as well due at least in part to tool limitations in filling high aspect ratio trenches. Capacitance is proportional to the dielectric constant and inversely proportional to the separation distance between two conductors. Thus, the reduction in feature sizes leads to an undesirable increase in trench parasitic capacitance.

The various components of capacitance associated with a trench isolation dielectric are illustrated in FIG. 2. More specifically, capacitances are shown in relation to trench (isolation) height 202. As shown, a horizontal trench parasitic capacitor 204 is shown in relation to trench width 206. In addition, depletion capacitor 208 and the corresponding depletion width 210 are also shown. Moreover, the contribution of a trench to junction capacitance 212 is also illustrated. A vertical trench parasitic capacitor 214 is shown, which varies with the trench height 202. Thus, this figure illustrates the various components of capacitance, including horizontal and vertical trench capacitances that will increase as technology advances enable trench dimensions to decrease.

In view of the above, what are needed are methods and compositions for defining an isolation structure with a low isolation parasitic capacitance.

SUMMARY OF THE INVENTION

The present invention provides methods and apparatus for forming an isolation structure on an integrated circuit substrate. This is accomplished through providing a multi-layer isolation structure having a reduced effective dielectric constant. In this manner, the isolation structure is advantageously designed to provide a low isolation parasitic capacitance.

In accordance with one embodiment, an isolation structure is formed on an integrated circuit substrate. A trench is etched in the integrated circuit substrate. A lower dielectric layer is then formed in the trench such that the lower dielectric layer at least partially fills the trench. In theory, an ideal fill candidate is a low dielectric constant insulator with an HF etch rate similar to SiO2. However, in practice, these materials are difficult to find. Therefore, an upper dielectric layer, with the desired HF etch resistance, is then formed over the lower dielectric layer to create an isolation structure, the upper dielectric layer and the lower dielectric layer together having an effective dielectric constant that is less than that of silicon dioxide, thereby enabling capacitance associated with the isolation structure to be reduced. More particularly, the vertical and/or horizontal effective dielectric constant may be calculated from the vertical and/or horizontal parasitic capacitances.

In accordance with another embodiment of the invention, an optimum thickness of the lower dielectric layer and the upper dielectric layer to be formed may be selected using information indicating an effective dielectric constant corresponding to thicknesses of both the lower dielectric material for the lower dielectric layer and the upper dielectric material for the upper dielectric layer. For instance, such information may be provided in graphical format, in a suitable data structure, or in the form of one or more equations. More particularly, the materials to be used for both the lower dielectric layer and the upper dielectric layer are initially selected. Next, the possible thickness range of the two materials is determined, typically as a strong function of the individual tool capability. Then, the values of the manufacturable individual thickness and dielectric constants are used (e.g., either by an equation, or graphically) to determine the resultant effective horizontal and vertical dielectric constants. The aim of this exercise is to reduce the effective parasitic capacitance, below that available from SiO2, while maintaining manufacturability.

In accordance with yet another embodiment of the invention, the thicknesses (or range of thicknesses) of the two materials are obtained through selecting the desired effective horizontal and/or vertical dielectric constant (or appropriate range of values) that is desired. The effective dielectric constant corresponds to thicknesses of both the lower dielectric material and the upper dielectric material. Thus, from the selected effective dielectric constant(s) it is possible to determine the thickness (or range of acceptable thicknesses) of both the lower dielectric layer and the upper dielectric layer that may be used to form the lower and upper dielectric layers of the isolation structure such that the desired capacitance values are achieved.

These and other features and advantages of the present invention are described below with reference to the drawings.

BRIEF DESCRIPTION OF THE DRAWINGS

FIG. 1 depicts a cross-sectional view of a portion of a semiconductor wafer showing various stages in the formation of a typical Shallow Trench Isolation (STI) structure using a single trench fill material.

FIG. 2 depicts the different components of capacitance associated with a trench isolation dielectric.

FIG. 3a depicts a cross-sectional view of a trench isolation scheme using multiple trench fill materials in accordance with one embodiment of the invention.

FIG. 3b depicts horizontal capacitance from the isolation structure of FIG. 3a as seen by two adjacent device structures.

FIG. 3c depicts vertical capacitance from the isolation structure of FIG. 3a as seen in the vertical dimension.

FIG. 4 depicts the effective dielectric constant and capacitance of the vertical parasitic trench capacitor with varying thicknesses of upper and lower dielectric layers in accordance with various embodiments of the invention.

FIG. 5 depicts the effective dielectric constant and capacitance of the horizontal parasitic trench capacitor with varying thicknesses of upper and lower dielectric layers in accordance with various embodiments of the invention.

DETAILED DESCRIPTION OF THE PREFERRED EMBODIMENTS

In the following description, numerous specific details are set forth in order to fully illustrate preferred embodiments of the present invention. It will be apparent, however, that the present invention may be practiced without limitation to some specific details presented herein. For example, the isolation structure described is formed primarily through two dielectric layers. However, the isolation structure may be formed in an alternate manner to achieve the same function. For instance, the isolation structure may be formed from multiple layers as well as different materials.

In order to provide a corresponding reduction in capacitance values, it is desirable to reduce the dielectric constant of the material used as the trench isolation material. While selecting a trench isolation material with a lower dielectric constant than silicon dioxide is possible, materials with low dielectric constants often exhibit high etch rates in HF solutions. This is undesirable since HF cleans are an integral part of standard IC fabrication and excessive removal of the isolating trench dielectric leads to device failure. Thus, in accordance with one embodiment of the invention, an upper and lower layer dielectric are formed such that a trench isolation structure having an effective dielectric constant below that of silicon dioxide is composed. The upper dielectric layer is chosen for its relatively lower HF etch rate. In one embodiment, this upper layer can simply remain SiO2. In this manner, a trench isolation structure having appropriate etch characteristics as well as a reduced parasitic capacitance is achieved.

FIG. 3a depicts a cross-sectional view of a trench isolation scheme using multiple trench fill materials in accordance with one embodiment of the invention. In order to form an isolation structure on an integrated circuit substrate, a trench is etched in the integrated circuit substrate. A thin trench liner 302 that substantially conforms to the trench is preferably formed along the Silicon interface to repair any etch-induced damage. The thickness of this liner 302 should be as small as possible. For example, the trench liner 302 may be between approximately 50 and approximately 200 Angstroms thick. The trench liner 302 may be any suitable dielectric, such as silicon dioxide. A silicon dioxide liner may thermally grown by heating the substrate to a temperature of about 1050° C. for about 8 minutes in an atmosphere of oxygen.

Next, a lower dielectric layer 304 is formed in the trench such that the lower dielectric layer 304 partially fills the trench. For instance, the lower dielectric layer 304 may be formed above the trench liner 302. The lower dielectric layer 304 is preferably a material with a dielectric constant much lower than SiO2. Thus, the lower dielectric layer 304 preferably has a dielectric constant below 3.9. More particularly, the lower dielectric layer 304 may be a Carbon doped silicon oxide (SiOx) such as SiOC, with a relative dielectric constant of 2.5. For instance, the lower dielectric layer 304 may be formed by depositing the Carbon doped silicon oxide by a hydrogen-peroxide assisted process, Ozone assisted deposition or organic spin-on material. Unlike the upper dielectric layer 306, the lower dielectric layer 304 may have a high Hydrofluoric acid (HF) etch rate, since the upper dielectric layer 306 will double as a protective capping layer, preventing any HF exposure to the lower dielectric layer 304.

An upper dielectric layer 306 is then formed over the lower dielectric layer to create an isolation structure. The thickness of the upper dielectric layer 306 is preferably less than the thickness of the lower dielectric layer 304. For instance, the thickness of the upper dielectric layer may be between approximately 200 Angstroms and approximately 600 Angstroms. In practice, some of the upper dielectric layer 306 materials with the desired HF etch rate qualities have a dielectric constant that is greater than that of the lower dielectric layer 304, but preferably not substantially higher than that of silicon dioxide (e.g., 3.9). For instance, the upper dielectric layer 306 may be amorphous Silicon Carbide (SiC), with a dielectric constant of 5.0 and a very low etch rate in HF solutions. This layer may be formed by applying an alkylsilane base precursor with PE-CVD or an Ozone assisted technique to form the amorphous SiC. Wet HF etch of SiO2 is highly selective to SiC. Depending upon the etch chemistry used, an etch selectivity of an SiC upper dielectric layer 306 to SiO2 of between approximately 5:1 and 30:1 may be achieved. This upper layer also serves as a protective layer that prevents excessive trench recess at the upper corners of the trench. Alternatively, the upper dielectric layer 306 may be silicon dioxide. When the upper dielectric layer 306 is formed from silicon dioxide, the resulting trench isolation structure will have a lower effective dielectric constant due to the lower dielectric constant of the silicon dioxide (in comparison with SiC). However, some of the HF etch resistance advantage will be lost if silicon dioxide is used as the upper dielectric layer 306.

It is important to note that in accordance with various embodiments of the invention, the upper dielectric layer 306 and the lower dielectric layer 304 together have an effective dielectric constant that is less than that of silicon dioxide (e.g., 3.9), thereby enabling capacitance associated with the isolation structure to be reduced. More specifically, the effective dielectric constant corresponds to at least one of horizontal and vertical capacitance associated with the isolation structure. However, it is preferable to reduce the effective dielectric constant associated with both vertical and horizontal capacitance. Simulations of the vertical and horizontal parasitic capacitances associated with the multi-component isolation structure will be described in further detail below with reference to FIGS. 4 and 5.

FIG. 3b depicts the horizontal capacitance from the isolation structure of FIG. 3a as seen by two adjacent device structures. The horizontal capacitance is essentially a sum of the individual capacitances from each layer (e.g., liner, lower and upper dielectric layers), and is therefore dominated by the largest capacitance component. Similarly, FIG. 3c depicts the vertical capacitance from the isolation structure of FIG. 3a as seen in the vertical dimension (e.g., by a polysilicon interconnect line above the trench). The vertical capacitance is due to the series combination of the three layers, and is therefore dominated by the smallest component. In accordance with various embodiments of the present invention, the multi-layer isolation structure provides a reduced effective dielectric constant that corresponds to the vertical and horizontal capacitance associated with the isolation structure.

The present invention reduces the effective dielectric constant and therefore reduced capacitance of the shallow trench isolation structure. More specifically, the above-described process reduces the contribution of the shallow trench isolation structure to the overall capacitance. FIGS. 4 and 5 illustrate the results of simulations of the vertical and horizontal capacitance, respectively, of the multi-component trench isolation structure. These simulations illustrate the effects of the thickness of the upper and lower dielectric layers on the two capacitances. More specifically, the models provide an equivalent dielectric constant and total capacitance of the composite trench isolation structure for the two capacitors. In these simulations, the thickness of the liner oxide is assumed to be a constant (i.e., 0.01 um) and then the total capacitance is studied for the thickness of the other two layers, in this example SiOC and SiC. In both figures, the dielectric constant and capacitance of a standard oxide filled trench are marked with a horizontal line for reference. The aim of the present invention is to optimize the thickness of the two layers, given the intrinsic individual dielectric constants, while reducing the total capacitance below that of the traditional oxide filled trench. More specifically, the thicknesses of one or both of the layers may be minimized while achieving a desirable effective dielectric constant and therefore an effective capacitance.

FIG. 4 depicts the effective dielectric constant and capacitance of the vertical parasitic trench capacitor with varying thicknesses of upper and lower dielectric layers in accordance with various embodiments of the invention. As shown, layer thickness 402 is plotted along the x-axis and effective dielectric constant 404 and total vertical capacitance 406 are plotted along the y-axes, as shown. Layer thicknesses are plotted corresponding to lower layer 408 (e.g., SiOC) and upper layer 410 (e.g., SiC). Effective dielectric constants 404 and total vertical capacitance 406 are plotted against corresponding values for a standard oxide filled trench, indicated by horizontal lines 412 and 414, respectively.

In accordance with one embodiment, an optimum thickness of the lower dielectric layer and the upper dielectric layer to be formed may be selected using such information (illustrated in graphical format in this example). More particularly, the materials to be used for both the lower dielectric layer and the upper dielectric layer are initially selected. For example, the materials for the lower and upper dielectric layers are shown here at 408 and 410. The intrinsic dielectric constants along with the available thickness of the materials are then used to calculate a total capacitance, from which an equivalent dielectric constant is extracted. This may be done by accessing simulated data, using one or more equations and/or using a graph as described in FIG. 4. In this manner, it is possible to iteratively select thickness values that will achieve the desired result. More specifically, a desired combined thickness of both the lower dielectric layer and the upper dielectric layer may be selected. In other words, this desired combined thickness will be approximately the depth of the trench less the thickness of the oxide liner (if separately formed). Since the total thickness is known, through selecting a thickness of either the lower or upper dielectric layer, the thickness of the remaining layer may be ascertained. Once the effective dielectric constant corresponding to the multi-layer trench isolation is generated, obtained or identified, it is possible to determine whether this effective dielectric constant is within a desired range of dielectric constants. If this result leads to a higher capacitance value than desired, the process may be iteratively repeated by re-selecting thicknesses of the two layers. Such an iterative process may also be desirable if technological limitations prevent deposition of a particular thickness of one or both of the layers. In this manner, it is possible to maximize the thickness of the lower dielectric layer having a low dielectric constant while minimizing the thickness of the upper dielectric layer, which may have a higher dielectric constant.

For those materials selected for the upper and lower dielectric layers, deposition equipment limitations typically determine the possible thickness ranges that may be deposited. Assuming data, equations and/or graphical information may be accessed that correlate possible thicknesses of the chosen materials with the effective dielectric constant(s), as shown and described above with reference to FIG. 4, this information may be used to later identify the material thicknesses that may be used to achieve a desired effective dielectric constant (or range of values). Thus, in accordance with another embodiment, the effective dielectric constant (or appropriate range of values) that is desired may be selected (e.g., from within a range of possible values for the selected materials), shown as y-axis 404. As described above, the effective horizontal and/or vertical dielectric constant may be used to obtain the thicknesses of both the lower dielectric material and the upper dielectric material. Thus, from the selected effective dielectric constant(s) it is possible to determine the thickness (or range of acceptable thicknesses) of the lower dielectric layer and the thickness of the upper dielectric layer that may be used to form the lower and upper dielectric layers of the isolation structure such that the desired capacitance values are achieved. Once the thicknesses (or range of acceptable thicknesses) are identified, the iterative process described above may be used to select specific thicknesses of the layers to be used.

FIG. 5 depicts the effective dielectric constant and capacitance of the horizontal parasitic trench capacitor with varying thicknesses of upper and lower dielectric layers in accordance with various embodiments of the invention. Similarly to FIG. 4, layer thickness 502 is plotted along the x-axis and effective dielectric constant 504 and total horizontal capacitance 506 are plotted along the y-axes, as shown. Layer thicknesses are plotted corresponding to lower layer 508 (e.g., SiOC) and upper layer 510 (e.g., SIC). Effective dielectric constants 504 and total horizontal capacitance 506 are plotted against corresponding values for a standard oxide filled trench, indicated by horizontal lines 512 and 514, respectively. Accordingly, through suitable choice of thickness of the lower and upper dielectric layers, significant reduction in parasitic capacitance can be achieved. The process described above to select dielectric layer thicknesses with respect to FIG. 4 (and vertical parasitic capacitance) may also be performed to achieve desired horizontal capacitance values or, alternatively, to verify that the thicknesses that achieve the desired result with respect to vertical capacitance also achieve desired horizontal capacitance values.

As described above with reference to FIGS. 4 and 5, information indicating an effective dielectric constant corresponding to thicknesses of both a lower dielectric material for the lower dielectric layer and an upper dielectric material for the upper dielectric layer may be used to select optimum thicknesses of both the lower and upper dielectric layers. In other words, the effective dielectric constant will correspond to relative thicknesses of the two dielectric layers. Although such information is illustrated in the form of a graph, corresponding equations or data may also be used.

The horizontal and vertical trench capacitances and the equivalent dielectric constants are listed below. The horizontal capacitor is described as follows $$\in_{horiz} \cdot t_{trench} = \in_{L1} \cdot t_{L1} + \in_{L2} \cdot t_{L2} + \in_{L3} \cdot t_{L3} \qquad (1)$$

where the $\in_{L1}$, $\in_{L2}$ and $\in_{L3}$ are the dielectric constants of layer 1, layer 2 and the liner oxide respectively. Similarly, $t_{L1}$, $t_{L2}$ and $t_{L3}$ are the thicknesses of layer 1, layer 2 and the liner oxide respectively. The equivalent dielectric constant of the horizontal capacitor, $\in_{horiz}$ is then calculated using the total trench depth, $t_{trench}$ and Eq. 1. The vertical trench capacitor is described by the following equation $$\frac{t_{trench}}{\varepsilon_{vert}} = \frac{t_{L1}}{\varepsilon_{L1}} + \frac{t_{L2}}{\varepsilon_{L2}} + \frac{t_{L3}}{\varepsilon_{L3}} \qquad (2)$$

where $\in_{vert}$ is equivalent dielectric constant of the vertical capacitor. Equations 1 and 2 can be plotted for a range of $t_{L1}$, $t_{L2}$ values to investigate the equivalent dielectric constants of the vertical and horizontal capacitors given the individual dielectric constants $\in_{L1}$ and $\in_{L2}$.

This information may be associated with vertical and/or horizontal capacitances. Moreover, the information provided in the form of graph(s), equation (s) or other suitable data set may include vertical as well as horizontal capacitances associated with the corresponding isolation structure.

A shallow trench isolation scheme is presented having a low combined dielectric constant. This scheme has been modeled and shown to reduce both the horizontal and vertical parasitic capacitors associated with the trench isolation. This overall reduction in parasitic capacitance will be important for future technologies as device dimensions continue to shrink. Moreover, this shallow trench isolation scheme, with proper choice of upper dielectric layer material, also exhibits an added advantage of protecting the STI corner from excessive etch induced recess.

After the isolation structure is formed, conventional fabrication steps that are well known in the art, including formation of well, gate oxide, and gate electrode, are performed. More particularly, gate, source and drain formation may be performed by employing preamorphization implants followed by dopant implantation and laser annealing. The doping and preamorphization implants are chosen to achieve acceptable device performance and shallow junctions.

The above-disclosed shallow trench isolation structure may be used in Complimentary Metal Oxide Semiconductor (CMOS) technology, where complimentary transistors (NMOS and PMOS) are fabricated adjacent to each other and separated by the isolation structure.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope of the appended claims.

What is claimed is:

1. A method of selecting a thickness of a lower dielectric layer and a thickness of an upper dielectric layer to be formed above the lower dielectric layer of a multi-layer isolation structure comprises:
    selecting a silicon oxycarbide (SiOC) material for a lower dielectric layer and one of a amorphous silicon carbide and a silicon dioxide material for an upper dielectric layer;
    selecting a range of one or more effective dielectric constants that correspond to thicknesses of both the lower dielectric material and the upper dielectric material; and
    determining a range of one or more thicknesses of each of the lower dielectric layer and the upper dielectric layer from the range of acceptable dielectric constants using information indicating an effective dielectric constant corresponding to thicknesses of both the lower dielectric material for the lower dielectric layer and the upper dielectric material for the upper dielectric layer, wherein the thicknesses of the upper and lower dielectric layers are arranged so that an effective dielectric constant for the multi-layer isolation structure is less than that of silicon dioxide and such that the parasitic capacitance of the multi-layer isolation structure is less than that of silicon dioxide thereby enabling the multi-layer isolation structure to be formed.

2. The method recited in claim 1, wherein the upper dielectric layer comprises amorphous silicon carbide.

3. The method recited in claim 1, wherein the upper dielectric layer comprises silicon dioxide.

4. The method recited in claim 1, wherein the thickness of the upper dielectric layer is less than the thickness of the lower dielectric layer.

5. The method recited in claim 1 wherein the effective dielectric constant corresponds to at least one of horizontal and vertical capacitance associated with the isolation structure.

6. The method recited in claim 1, wherein the effective dielectric constant of the isolation structure corresponds to relative thicknesses of both the first and second dielectric layers.

7. The method recited in claim 1, wherein the second dielectric layer is formed of a material having a greater HF etch resistance than silicon dioxide.

8. The isolation structure as recited in claim 7, wherein the upper dielectric layer has an HF etch selectivity of between approximately 5:1 and approximately 30:1 to silicon dioxide.

9. The method recited in claim 1, wherein aggregate thickness for said upper and lower dielectric layers of the multi-layer isolation structure is constrained by an isolation trench depth into which the multi-layer isolation structure is to be formed.

10. The method recited in claim 9, wherein a liner layer to be used with said multi-layer isolation layer is introduced into the calculation of the thicknesses for said upper and lower layers.

11. The method recited in claim 1, wherein determining a range of said one or more thicknesses of each of the lower dielectric layer and the upper dielectric layer includes using a model of that includes at least one of dielectric constants for the upper and lower materials, upper and lower dielectric layer thickness, and capacitance information associated with said layers.

12. The method recited in claim 11, wherein determining a range of said one or more thicknesses of each of the lower dielectric layer and the upper dielectric layer includes using a model of that includes at least one of dielectric constants for the upper and lower materials, upper and lower dielectric layer thickness, and capacitance information associated with said layers.

13. The method recited in claim 12, wherein the model uses simulated data.

14. The method recited in claim 11, wherein the process of determining thicknesses of each of the lower dielectric layer and the upper dielectric layer with said model comprises using an iterative process to identify appropriate thicknesses for said upper and lower dielectric layers.

15. A method of selecting a thickness of a lower dielectric layer and a thickness of an upper dielectric layer to be formed above the lower dielectric layer of a multi-layer isolation structure comprises:
    selecting a lower dielectric material for the lower dielectric layer and an upper dielectric material for the upper dielectric layer;
    selecting a range of one or more effective dielectric constants that correspond to thicknesses of both the lower dielectric material and the upper dielectric material; and
    determining a range of one or more thicknesses of each of the lower dielectric layer and the upper dielectric layer from the range of acceptable dielectric constants using information indicating an effective dielectric constant corresponding to thicknesses of both the lower dielectric material for the lower dielectric layer and the upper dielectric material for the upper dielectric layer, thereby enabling the multi-layer isolation structure to be formed such that the thicknesses of the upper and lower dielectric layers are arranged so that an effective dielectric constant for the multi-layer isolation structure is less than that of a silicon dioxide layer.

16. The method of claim 15 wherein the thicknesses of the upper and lower dielectric layers are arranged so that a parasitic capacitance of the multi-layer isolation structure is less than that of silicon dioxide.

17. The method of claim 16 wherein
    said lower dielectric layer is formed of a silicon oxycarbide (SiOC) material; and
    said upper dielectric layer is formed of one of amorphous silicon carbide and silicon dioxide.

18. The method of claim 16 further comprising forming said dielectric layers on a substrate.

19. The method of claim 18 wherein said forming of the dielectric layers on the substrate comprises forming the dielectric layers on a trench structure on a silicon substrate.

20. The method recited in claim 15, wherein aggregate thickness for said upper and lower dielectric layers of the multi-layer isolation structure is constrained by an isolation trench depth into which the multi-layer isolation structure is to be formed.

21. The method recited in claim 20, wherein a liner layer to be used with said multi-layer isolation layer is introduced into the calculation of the thicknesses for said upper and lower layers.

* * * * *